United States Patent
Bok et al.

(10) Patent No.: US 11,018,202 B2
(45) Date of Patent: May 25, 2021

(54) DISPLAY DEVICE

(71) Applicant: SAMSUNG DISPLAY CO., LTD., Yongin-si (KR)

(72) Inventors: Seung-Lyong Bok, Yongin-si (KR); Sun Mi Yu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 29 days.

(21) Appl. No.: 16/555,365

(22) Filed: Aug. 29, 2019

(65) Prior Publication Data

US 2020/0083301 A1 Mar. 12, 2020

(30) Foreign Application Priority Data

Sep. 7, 2018 (KR) ........................ 10-2018-0106909

(51) Int. Cl.
| | | |
|---|---|---|
| *H01L 27/32* | (2006.01) | |
| *H01L 51/52* | (2006.01) | |
| *G06K 9/00* | (2006.01) | |
| *H04M 1/02* | (2006.01) | |

(52) U.S. Cl.
CPC ........ *H01L 27/3223* (2013.01); *G06K 9/0004* (2013.01); *H01L 27/3272* (2013.01); *H01L 27/3276* (2013.01); *H01L 51/5253* (2013.01); *H04M 1/0266* (2013.01)

(58) Field of Classification Search
CPC ............. H01L 27/3223; H01L 27/3272; H01L 51/5253; H01L 27/3225; H01L 27/323; G06K 9/0004; H04M 1/0266; H04M 1/185; H04M 1/026; H04M 2250/12; G02F 1/13338
See application file for complete search history.

(56) References Cited

U.S. PATENT DOCUMENTS

| | | | |
|---|---|---|---|
| 6,822,263 B2 | 11/2004 | Satou et al. | |
| 7,759,863 B2 | 7/2010 | Kim et al. | |
| 2008/0225254 A1* | 9/2008 | Komine | ............... G03F 7/70633 355/53 |
| 2012/0267611 A1* | 10/2012 | Chung | ................ H01L 27/3272 257/40 |
| 2015/0316806 A1* | 11/2015 | Chang | .................... G06F 3/0446 345/174 |
| 2015/0379923 A1 | 12/2015 | Lee et al. | |
| 2017/0032164 A1 | 2/2017 | Liu et al. | |
| 2017/0263564 A1* | 9/2017 | Kim | ..................... H01L 51/0012 |
| 2017/0270335 A1* | 9/2017 | Evans, V | .............. G06F 1/1637 |
| 2018/0005007 A1* | 1/2018 | Du | ........................ G06K 9/2036 |
| 2018/0151641 A1* | 5/2018 | Choo | ..................... G06F 1/1643 |
| 2019/0004354 A1* | 1/2019 | Hsiao | ................. G06K 9/00053 |
| 2019/0393277 A1* | 12/2019 | An | ...................... H01L 27/3276 |

FOREIGN PATENT DOCUMENTS

| | | |
|---|---|---|
| KR | 10-2007-0033073 A | 3/2007 |
| KR | 10-2007-0039299 A | 4/2007 |
| KR | 10-1796660 61 | 11/2017 |
| KR | 10-2017-0141522 A | 12/2017 |

\* cited by examiner

*Primary Examiner* — Yasser A Abdelaziez
(74) *Attorney, Agent, or Firm* — Kile Reed Park & Houtteman PLLC

(57) ABSTRACT

A display device includes a display panel, a protective sheet at a rear side of the display panel, the protective sheet including an opening, a sensor in the opening, and a pattern in the display panel, the pattern overlapping the opening.

22 Claims, 11 Drawing Sheets

DISPLAY DEVICE

CROSS-REFERENCE TO RELATED APPLICATION

Korean Patent Application No. 10-2018-0106909, filed on Sep. 7, 2018, in the Korean Intellectual Property Office, and entitled: "Display Device," is incorporated by reference herein in its entirety.

BACKGROUND

1. Field

Embodiments relate to a display device including a sensor.

2. Description of the Related Art

Along with development of information and communication technologies, mobile phones have included various new functions besides calling and text messaging. In addition, the use of a mobile phone in the form of a smart phone that is capable of surfing the web through an Internet connection and running various applications has become common.

Various applications can not only be run through input information by a user, but can also be run by using a signal from a sensor installed in the phone. In particular, a sensor that can identify who the user is for security is also being installed in the mobile phone.

SUMMARY

Embodiments are directed to a display device including a display panel, a protective sheet at a rear side of the display panel, the protective sheet including an opening, a sensor in the opening, and a pattern in the display panel, the pattern overlapping the opening.

The display panel may include a substrate and a buffer layer on the substrate.

The pattern may be between the substrate and the buffer layer.

The pattern may include an alignment pattern around the sensor.

The alignment pattern may include at least one alignment mark.

The alignment mark may be at corners of the opening.

The pattern may include an inspection pattern that includes a plurality of inspection lines.

The plurality of inspection lines may include an inspection line that overlaps the sensor and an inspection line that does not overlap the sensor.

The plurality of inspection lines may include an inspection line that is parallel with at least one side of the sensor.

The pattern may include a light blocking pattern.

The pattern may include a light blocking pattern that does not overlap the alignment pattern.

The light blocking pattern may include at least one light blocking layer on at least one side of the sensor.

The display panel may further includes a transistor on the buffer layer and a light blocking layer between the substrate and the buffer layer. The light blocking layer may overlap a semiconductor layer of the transistor. The pattern is at a same layer as the light blocking layer.

The pattern and the light blocking layer may be made of a same material. The same material may include a metal or a metal alloy.

The sensor may be a fingerprint sensor.

Embodiments are also directed to a display device including a display panel, a protective sheet attached to a rear side of the display panel, and a sensor attached to the rear side of the display panel. The protective sheet includes an opening that penetrates the protective sheet. The sensor is in the opening. The display panel includes a pattern that overlaps the opening.

The display panel may include a substrate. The substrate may include a first surface that faces a front side of the display panel and a second surface that faces the rear side of the display panel. The pattern may be on the first surface of the substrate.

The display panel may further include a transistor on the substrate and a light blocking layer between the substrate and the transistor. The pattern may be made of a same material as the light blocking layer and may be on a same layer as the light blocking layer.

The pattern may include an opening. The light blocking layer may be in the opening.

The pattern may include an alignment pattern that includes at least one alignment mark at the periphery of the sensor.

The pattern may include an inspection pattern that includes an inspection line that does not overlap the sensor and an inspection line that overlaps the sensor.

The pattern may include at least one light blocking layer at at least one side of the sensor. The at least one light blocking layer may not overlap the alignment pattern.

Embodiments are also directed to a display device including a display panel, a protective sheet attached to a rear side of the display panel, and a sensor attached to the rear side of the display panel. The protective sheet includes an opening that penetrates the protective sheet. The sensor is in the opening. The display panel includes a pattern that overlaps the opening and is around an attachment region of the sensor. The pattern is made of a same material as an electrode of the display panel and is on a same layer as the electrode of the display panel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
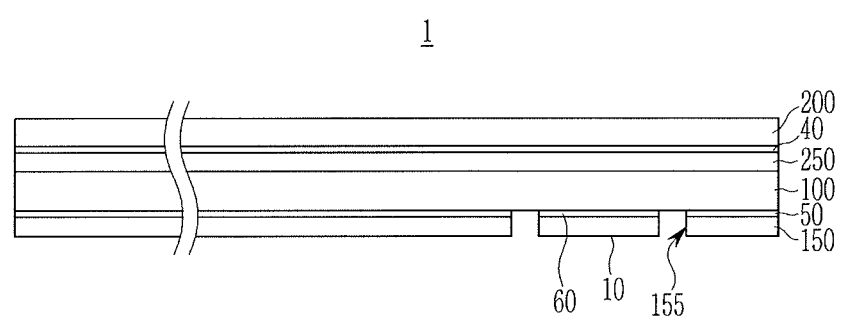
FIG. 1 illustrates a cross-sectional view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

In addition, in this specification, the phrase "on a plane" means viewing a target portion from the top, and the phrase "on a cross-section" means viewing a cross-section formed by vertically cutting a target portion from the side.

In the specification, the term "overlap" implies overlapping "on a plane" unless otherwise specified.

Hereinafter, display devices according to exemplary embodiments will be described in detail with reference to the accompanying drawings. An organic light emitting diode (OLED) display will be exemplarily illustrated as a display device. In some implementations, the display device may be another suitable display device, such as, for example, a liquid crystal display.

FIG. 1 illustrates a cross-sectional view of a display device according to an exemplary embodiment.

A display device 1 includes a display panel 100, a protective sheet 150, a window 200, a polarization layer 250, and a sensor 10. The display device 1 may further include an adhesive layer 40 that bonds the window 200 to the polarization layer 250, an adhesive layer 50 that bonds the protective sheet 150 to the display panel 100, and an adhesive layer 60 that bonds the sensor 10 to the display panel 100.

The display panel 100 may be an organic light emitting panel. The display panel 100 may include a substrate, and pixel circuits and light emitting elements formed on the substrate. The display panel 100 may further include an encapsulation layer that covers the substrate, the pixel circuits, and the light emitting elements to prevent the permeation of moisture or the like from the outside. A single pixel may include one pixel circuit and one light emitting element. The substrate may be a transparent insulation substrate made of glass, plastic, or the like.

As a portion that, The pixel circuit may be disposed on the substrate to supply a predetermined current to a light emitting element based on an externally applied signal. The light emitting element may be disposed on the pixel circuit. The light-emitting element may include an emission layer. A current supplied from the pixel circuit may flow in the light emitting element, and luminance of light emitted from the emission layer may be changed depending on intensity of the current. Thereby, grayscales may be expressed.

The polarization layer 250 and the window 200 may be disposed at a front side of the display panel 100. The adhesive layer 40 may be disposed between the window 200 and the polarization layer 250 for attaching the window 200 to the polarization layer 250. The polarization layer 250 may increase a contrast ratio and visibility by reducing reflection of external light. In some implementations, the polarization layer 250 may be omitted. The window 200 may protect the front side of the display panel 100. The window 200 may be coated with a functional layer such as an antiglare layer, an anti-fingerprint layer, or the like. As the adhesive layer 40, an optically transparent adhesive or a resin such as an optically clear adhesive (OCA), an optically clear resin (OCR), or the like may be used.

The display device 1 may further include a touch sensor layer that can sense a touch inside the display panel 100 or at the front side of the display panel 100. For example, a sense electrode that can sense a touch in the display panel 100 may be further formed, or a substrate where a touch electrode is formed may be disposed between the display panel 100 and the polarization layer 250.

The protective sheet 150 may be disposed at a rear side of the display panel 100 and may include an opening 155. The opening 155 in the protective sheet 150 may be formed to penetrate the protective sheet 150. Accordingly a rear side area of the display panel 100, corresponding to the opening 155, may be exposed therethrough. The adhesive layer 50 may be disposed between the display panel 100 and the protective sheet 150 for attaching the protective sheet 150 to the display panel 100. The protective sheet 150 may include a black layer that is colored black to make the display panel 100 look darker than when displaying black. In addition, the protective sheet 150 may include a cushion layer or an embossing layer to prevent the rear side of the display panel 100 from being damaged. The protective sheet 150 may include at least one functional layer such as a shield layer, a head radiation protective layer, or the like.

In FIG. 1, the protective sheet 150 is shown as being disposed only at the rear side of the display panel 100. In some implementations, the protective sheet 150 may extends to a side surface of the display panel 100 to protect the side surface of the display panel 100.

The sensor 10 may be disposed in the opening 155 of the protective sheet 150. The opening 155 may correspond to a portion where the protective sheet 150 is cut out and where the protective sheet 150 has a region corresponding to the opening 155. The opening 155 may be formed after the protective sheet 150 is attached to the display panel 100, In some implementations, the protective sheet 150, including the opening 155 already formed, may be attached to the display panel 100. A portion of the adhesive layer 50 overlapping the opening 155 may be removed, as shown in FIG. 1, or may remain.

The sensor 10 may be a fingerprint sensor that senses a fingerprint of a user that contacts or approaches the display device 1 from the front side of the display panel 100. The sensor 10 may be disposed in the opening 155 of the protective sheet 150 to sense the user's fingerprint at the front side of the display panel 100 without interference of the protective sheet 150.

The sensor 10 may be attached to the rear side of the display panel 100 by the adhesive layer 60, which may be formed of an adhesive such as an OCA, an OCR, or the like, or by a double-sided adhesive tape. Selectively or additionally, the sensor 10 may be fixed to the display panel 100 by a resin that surrounds sides of the sensor 10.

Figure 2:
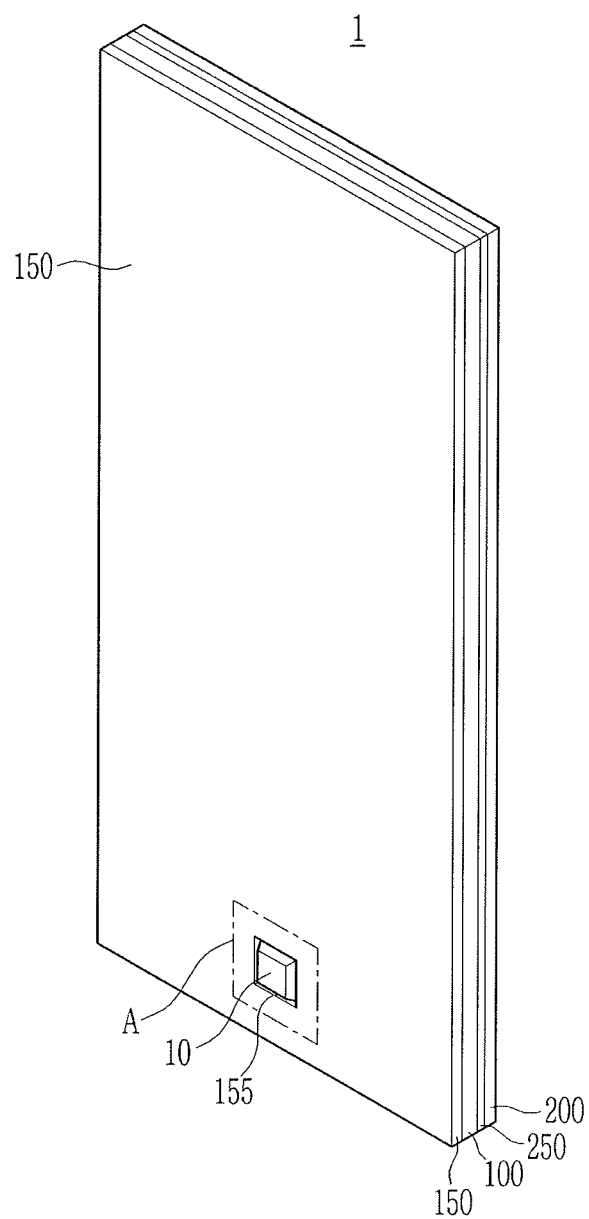
FIG. 2 illustrates a bottom perspective view of the display device according to the exemplary embodiment.
Figure 3:
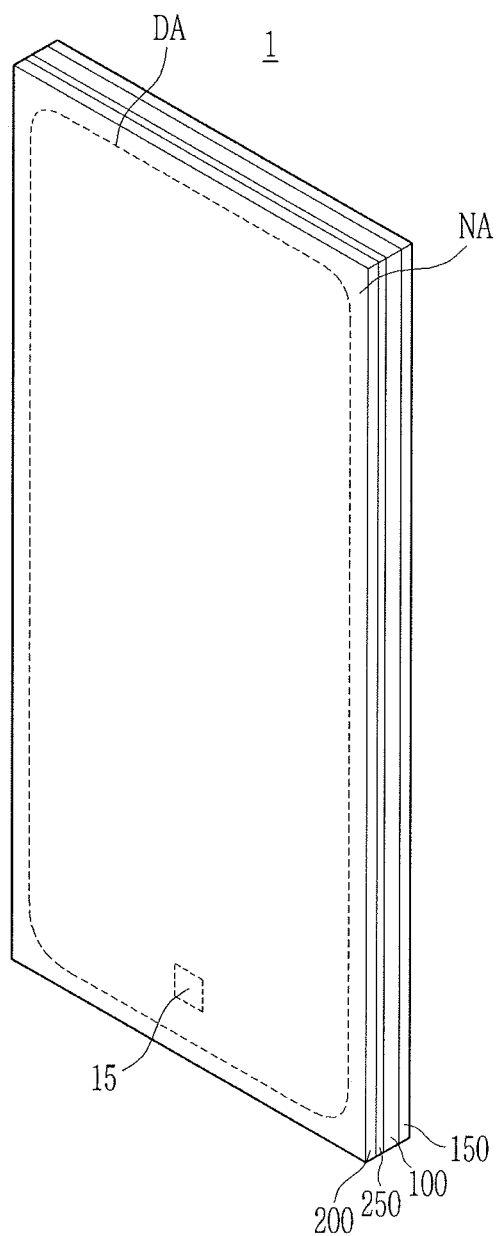
FIG. 3 illustrates a top perspective view of the display device according to the exemplary embodiment.

FIG. 2 illustrates a bottom-side perspective view of the display device according to the exemplary embodiment, and FIG. 3 illustrates a front-side perspective view of the display device according to the exemplary embodiment. FIG. 2 and FIG. 3 illustrate examples of the display device as used in a mobile phone or a smart phone.

Referring to FIG. 2, the protective sheet 150 may be disposed throughout the rear side of the display device, The sensor may be disposed in the opening 155 of the protective sheet 150.

Referring to FIG. 3, a display device DA (which corresponds to a screen) where an image is displayed may occupy almost all of the front side of the display device 1. Another area of the front side of the display device 1 may be occupied by a non-display area NA. Depending on exemplary embodiments, the display area DA may wholly cover the front side of the display device 1, or may be disposed at a side or a part of the bottom side of the display device 1.

A region 15 (hereinafter referred to as a fingerprint sensing region 15) where a fingerprint can be sensed may exist in the display area DA. The fingerprint sensing region 15 may be provided at various locations depending on a use state of an electronic device where the display device 1 is applied, and may be provided at two or more locations. For example, the fingerprint sensing region 15 may correspond to an area where the sensor 10 is disposed. FIG. 2 and FIG. 3 illustrate an exemplary embodiment in which the area where the sensor 10 is disposed at the rear side in the display device 1, that is, an exemplary embodiment in which the fingerprint sensing region 15 is disposed in the display area DA, and particularly disposed at a lower end in the display area DA. In some implementations, the fingerprint sensing region 15 may be disposed on another portion of the display area DA.

Figure 4:
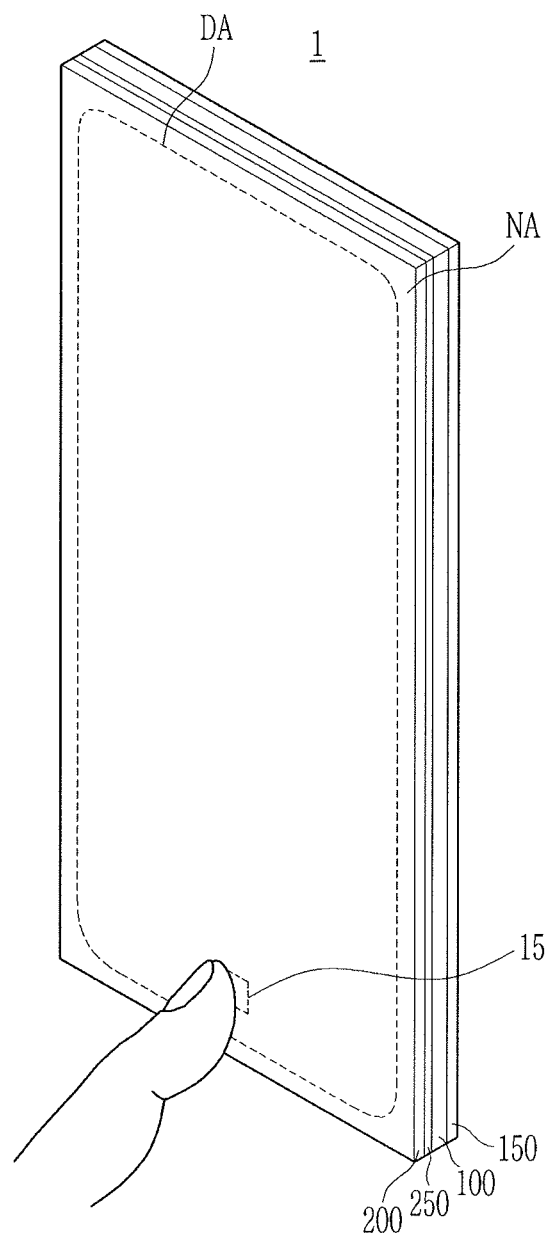
FIG. 4 illustrates a case in which a user touches a fingerprint sensing area with their finger.

FIG. 4 illustrates a user touching the fingerprint sensing region.

When a user touches the fingerprint sensing region 15 with a finger, the sensor 10 disposed at the rear side of the display panel 100 may sense the fingerprint. The window 200, the polarization layer 250, and the display panel 100 may be disposed between the sensor 10 and the user's finger. The sensor 10 may sense a fingerprint by collecting and processing light that is emitted from a pixel (for example, an emission layer) in the display area DA of the display panel 100, reflected by a finger, and then transmitted to the sensor 10 through the window 200, the polarization layer 250, and the display panel 100. The fingerprint pattern may be detected by sensing a part of a finger, unlike a method of photographing an image with a camera or the like. Accordingly, a part of the sensor 10 may be positioned on the display panel 100 even if it is covered by a pixel of the display panel 100 or the like. Depending on exemplary embodiments, a light emission portion other than the pixel may be used as a light source for sensing a fingerprint.

Hereinafter, a peripheral area where the sensor 10 is attached will be described with reference to FIG. 5 and FIG. 6.

Figure 5:
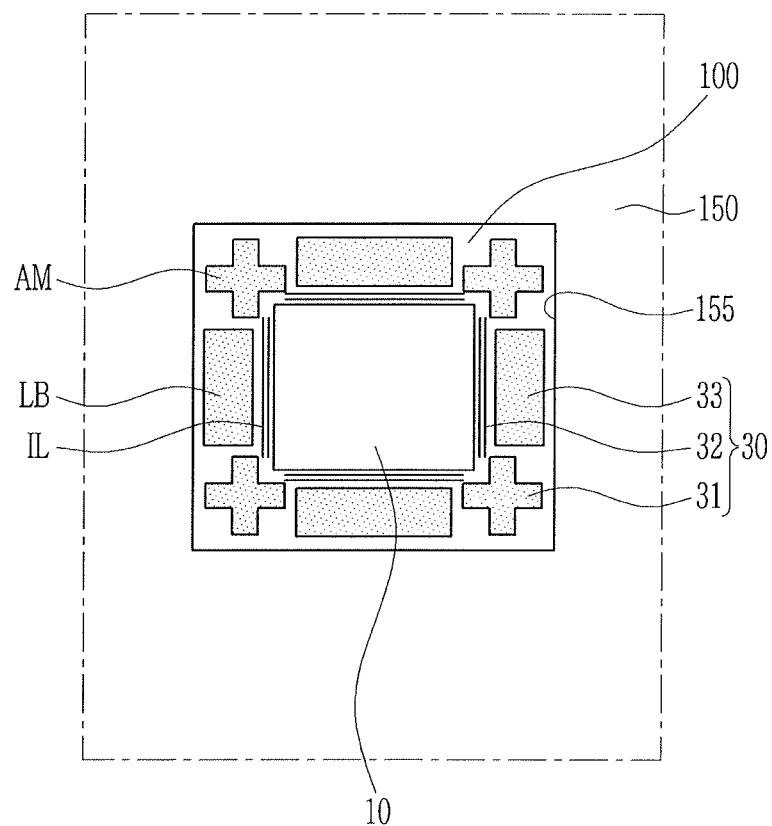
FIG. 5 illustrates a top plan view of an exemplary embodiment of the area A in FIG. 2.
Figure 6:
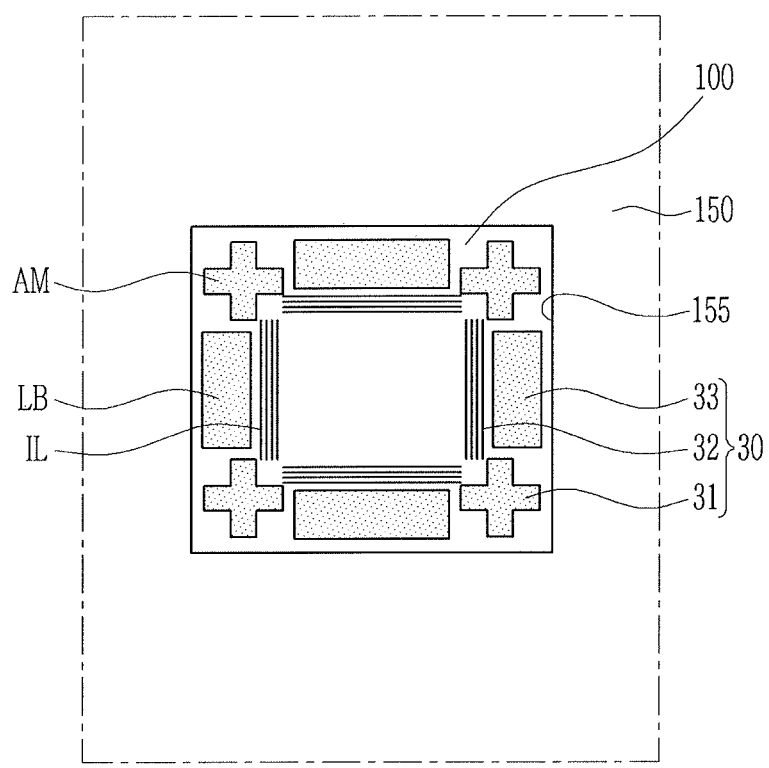
FIG. 6 illustrates a top plan view of a state before a sensor is attached.

FIG. 5 illustrates a top plan view of an exemplary embodiment of the area A in FIG. 2, and FIG. 6 illustrates a top plan view of a state before the sensor 10 is attached.

FIG. 5 illustrates a peripheral area where a sensor 10 is attached. In order to attach the sensor 10 to a display panel 100, the opening 155 may be formed in the protective sheet 150, and the sensor 10 may be disposed in the opening 155. The sensor 10 may have a suitable shape. For example, the sensor 10 may have a substantially rectangular planar shape. The opening 155 may have, for example, a substantially rectangular shape.

A pattern 30 may also be disposed in the opening 155. The pattern 30 may be disposed to overlap the display panel 100.

The pattern 30 may be made and formed of the same material, and through the same process, as a layer formed in the display panel 100. For example, the pattern 30 may be made and formed of the same material through the same process as a light blocking layer formed in the display panel 100. In this case, an additional process or use of a mask to form the pattern 30 may be avoided. The light blocking layer will be described below.

The pattern 30 may include at least one of an alignment pattern 31, an inspection pattern 32, and a light blocking pattern 33.

The alignment pattern 31 may be used to align the sensor 10 to thereby attach the sensor 10 at a precise position. The alignment pattern 31 may be recognized by a detection means such as a camera so as to enable the sensor 10 to be precisely aligned to a targeted position. The alignment pattern 31 may be disposed at the periphery of the sensor 10.

The alignment pattern 31 may include one or more alignment marks AM. For example, an alignment mark AM may be disposed at four corners of the opening 155. In some implementations, alignment marks AM may be disposed at two of four corners of the opening 155. The alignment marks AM may be disposed at the periphery of the sensor 10 without overlapping the sensor 10. In some implementations, at least a part of the alignment mark AM may be overlap with the sensor 10. Each of the alignment marks AM may have a planar cross shape.

The inspection pattern 32 may be used to inspect whether the sensor 10 is attached to the targeted position. The inspection pattern 32 may include a plurality of inspection lines IL. The plurality of inspection lines IL of the inspection pattern 32 may be parallel with four sides of the sensor 10. Referring to FIG. 6 together with FIG. 5, some of the inspection lines IL may not overlap with the sensor 10, and others of the inspection lines IL may overlap with the sensor 10. The inspection pattern 32 may include inspection lines IL that are disposed in an area where the sensor 10 is attached. When the inspection pattern 32 is formed as described above, it can be easily detected whether the sensor 10 is attached to the targeted portion simply by determining the number of lines that do not overlap the sensor by visual inspection or the like.

For example, after the sensor 10 is attached, when the number of inspection lines IL shown at the left side of the sensor 10 is one and the number of inspection lines IL shown at the right side of the sensor 10 is three, it can be determined that the sensor 10 is biased to the left. When the number of inspection lines IL shown at the left side of the sensor 10 is two and the number of inspection lines IL shown at the right side of the sensor 10 is two, it can be determined that the sensor 10 is horizontally balanced. Similarly, when the number of inspection lines IL shown at the upper side of the sensor 10 is two and the number of inspection lines IL shown at the lower side of the sensor 10 is two, it can be determined that the sensor 10 is vertically balanced.

The light blocking pattern 33 may be disposed in an area of the opening in which the sensor 10 and the alignment pattern 31 are not disposed. Since the opening 155 is an area where the protective sheet 150 is removed, there is a possibility that light could be introduced to the display panel 100 through the opening 155. An area where the sensor 10 is disposed in the opening 155 may be blocked from light by the sensor 10, but depending on exemplary embodiments, the periphery of the sensor 10 may be viewed differently. For example, the periphery of the sensor 10 may be viewed as a stain due to light introduced to the periphery of the sensor 10 when the display device 1 is viewed from the front. Thus, the light blocking pattern 33 may be formed at the periphery of the sensor 10 to minimize the introduction of light through the opening 155.

The light blocking pattern 33 may include a plurality of light blocking layers LB. For example, the light blocking layers LB may be respectively disposed at the left, the right, the top, and the bottom of the sensor 10. In order to allow the alignment marks MA and the inspection lines IL to be recognized, the light blocking layers LB may be formed at a distance from the alignment marks AL and the inspection lines IL.

Figure 7:
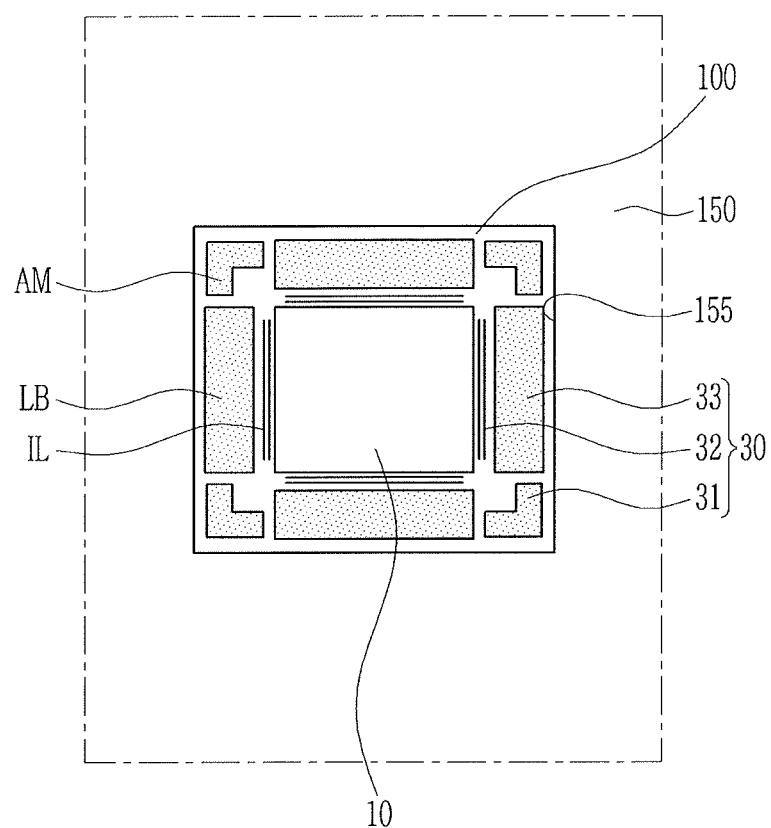
FIG. 7 and FIG. 8 illustrate top plan views respectively showing exemplary embodiments of the area A in FIG. 2.
Figure 8:
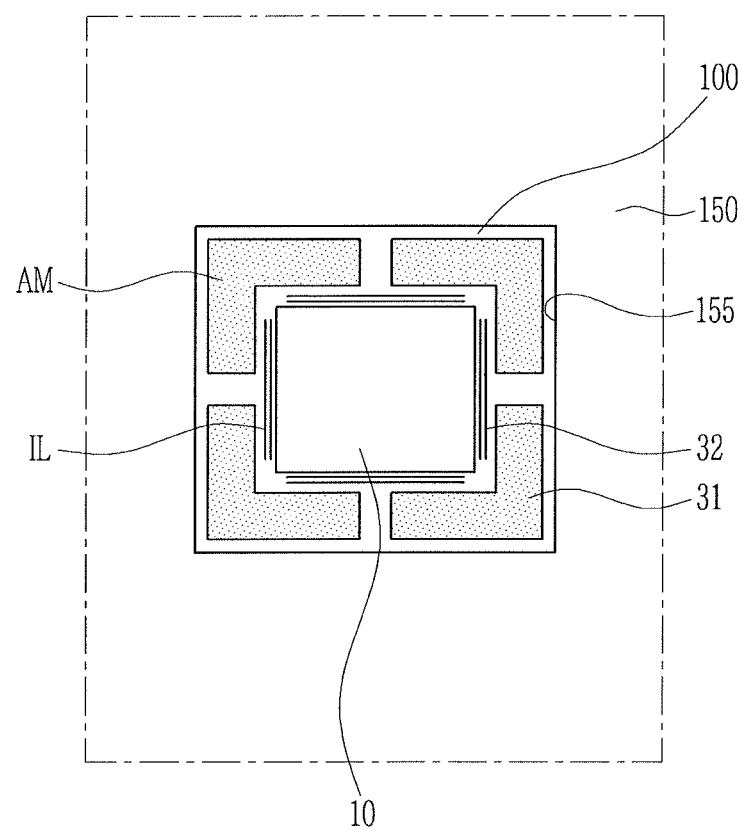

FIG. 7 and FIG. 8 illustrate top plan views respectively depicting exemplary embodiments of the area A in FIG. 2.

Referring to FIG. 7, a shape of the alignment mark AM may be different from that of the exemplary embodiment of FIG. 5. For example, The alignment mark AM may have a suitable shape that is recognizable by a detection means. For example, the alignment mark may have various shapes such as a polygon, a circle, an oval, a character, or the like. For example, the alignment mark may have a shape of squared brackets (〚〛).

Referring to FIG. 8, as shown in the exemplary embodiment of FIG. 7, the alignment marks AM may be formed in the shape of squared brackets. The size of the squared brackets may be larger than those shown in FIG. 7. In this case, the alignment marks AM may occupy almost all of the remaining area where the sensor 10 is disposed in the opening 155. Accordingly, the introduction of light to the display panel 100 may be blocked by the alignment marks AM. Thus, in the exemplary embodiment of FIG. 8, the pattern 30 may not include the above-described light blocking pattern 33.

Hereinafter, a display device according to an exemplary embodiment will be described, focusing on a pixel of a display area with reference to FIG. 9, FIG. 10, and FIG. 11. In order to illustrate the relationship with the other components of the display device, reference is also made to the other drawings.

Figure 9:
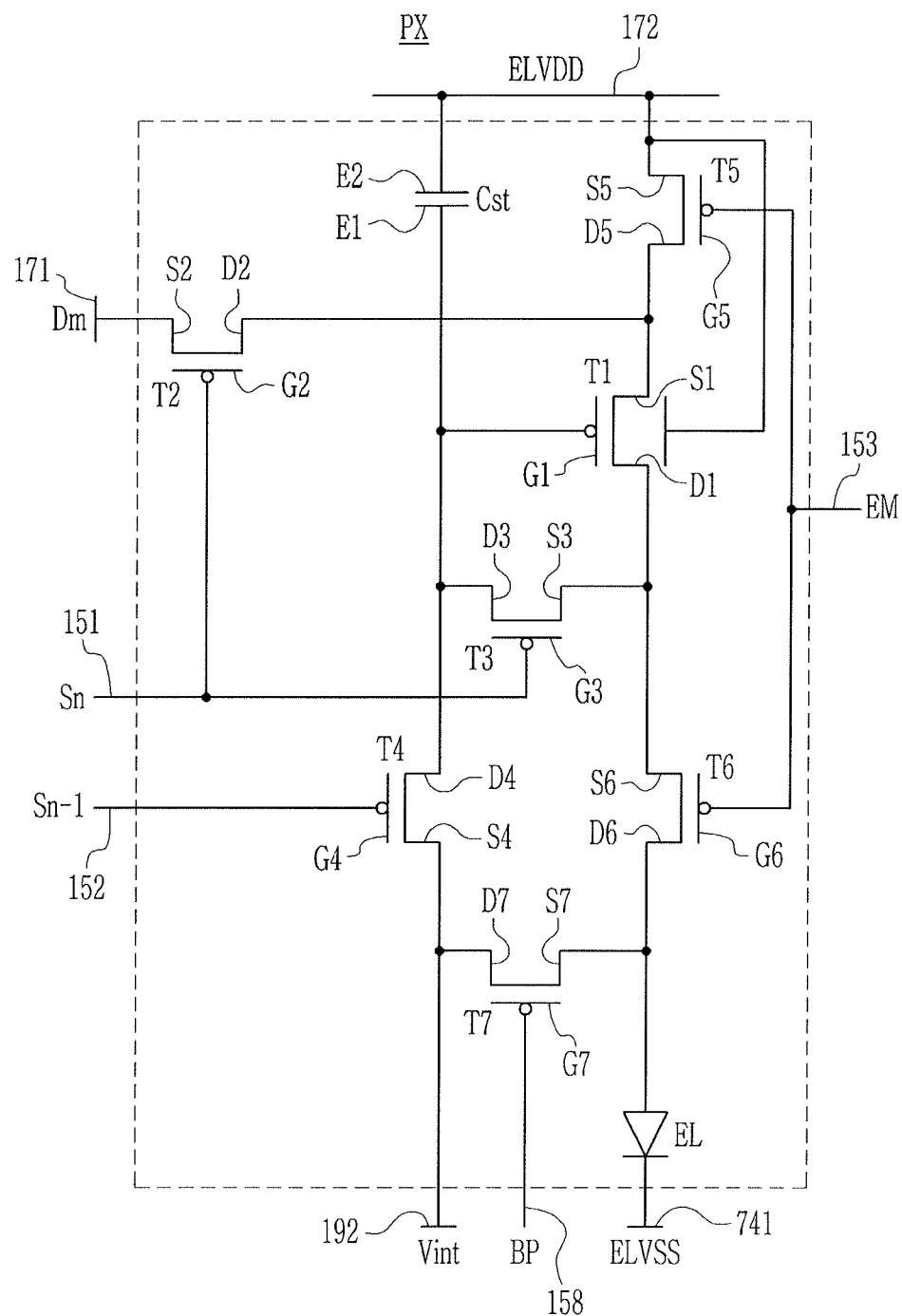
FIG. 9 illustrates an equivalent circuit diagram of a pixel of the display device according to the exemplary embodiment.

FIG. 9 illustrates an equivalent circuit diagram of a pixel of a display device according to an exemplary embodiment. FIG. 10 is a layout view of some pixels of the display device according to the exemplary embodiment. FIG. 11 is a cross-sectional view of FIG. 10, taken along the line XI-XI'. Pixels shown in FIG. 10 may be pixels disposed in an area that overlaps an opening 155 in a protective sheet 150.

Referring to FIG. 9, a pixel PX disposed in a display area DA in the display device according to the present exemplary embodiment may include transistors T1 to T7 connected to display signal lines 151, 152, 153, 158, 171, 172, and 192, a storage capacitor Cst, and a light emitting element EL.

The transistors T1 to T7 may include a driving transistor T1, a switching transistor T2, a compensation transistor T3, an initialization transistor T4, an operation control transistor T5, a light emission control transistor T6, and a bypass transistor T7.

The display signal lines 151, 152, 153, 158, 171, 172, and 192 may include scan lines 151, previous scan lines 152, light emission control lines 153, bypass control lines 158, data lines 171, driving voltage lines 172, and initialization voltage lines 192.

The previous scan line 152 may transmit a previous scan signal Sn-1 to the initialization transistor T4. The light emission control line 153 may transmit an emission control signal EM to the operation control transistor T5 and the light emission control transistor T6. The bypass control line 158 may transmit a bypass signal BP to the bypass transistor T7.

The data line 171 may receive a data signal Dm. The driving voltage line 172 and the initialization voltage line 192 may respectively receive a driving voltage ELVDD and an initialization voltage Vint. The initialization voltage Vint may initialize the driving transistor T1.

The transistors T1 to T7 may respectively include gate electrodes G1 to G7, source electrodes S1 to S7, and drain electrodes D1 to D7. The storage capacitor Cst may include a first electrode E1 and a second electrode E2. The electrodes of the transistors T1 to T7 and the electrodes of the storage capacitor Cst may be connected with each other, as shown in FIG. 9. An anode of the light emitting element EL, which may be an organic light emitting diode (OLED), may be connected with the drain electrode D1 of the driving transistor T1 via the light emission control transistor T6. A cathode of the light emitting element EL may be connected with a common voltage line 741 that transmits a common voltage ELVSS.

The number of transistors, the number of capacitors, and a connection between the transistor and the capacitor may be variously modified.

Figure 10:
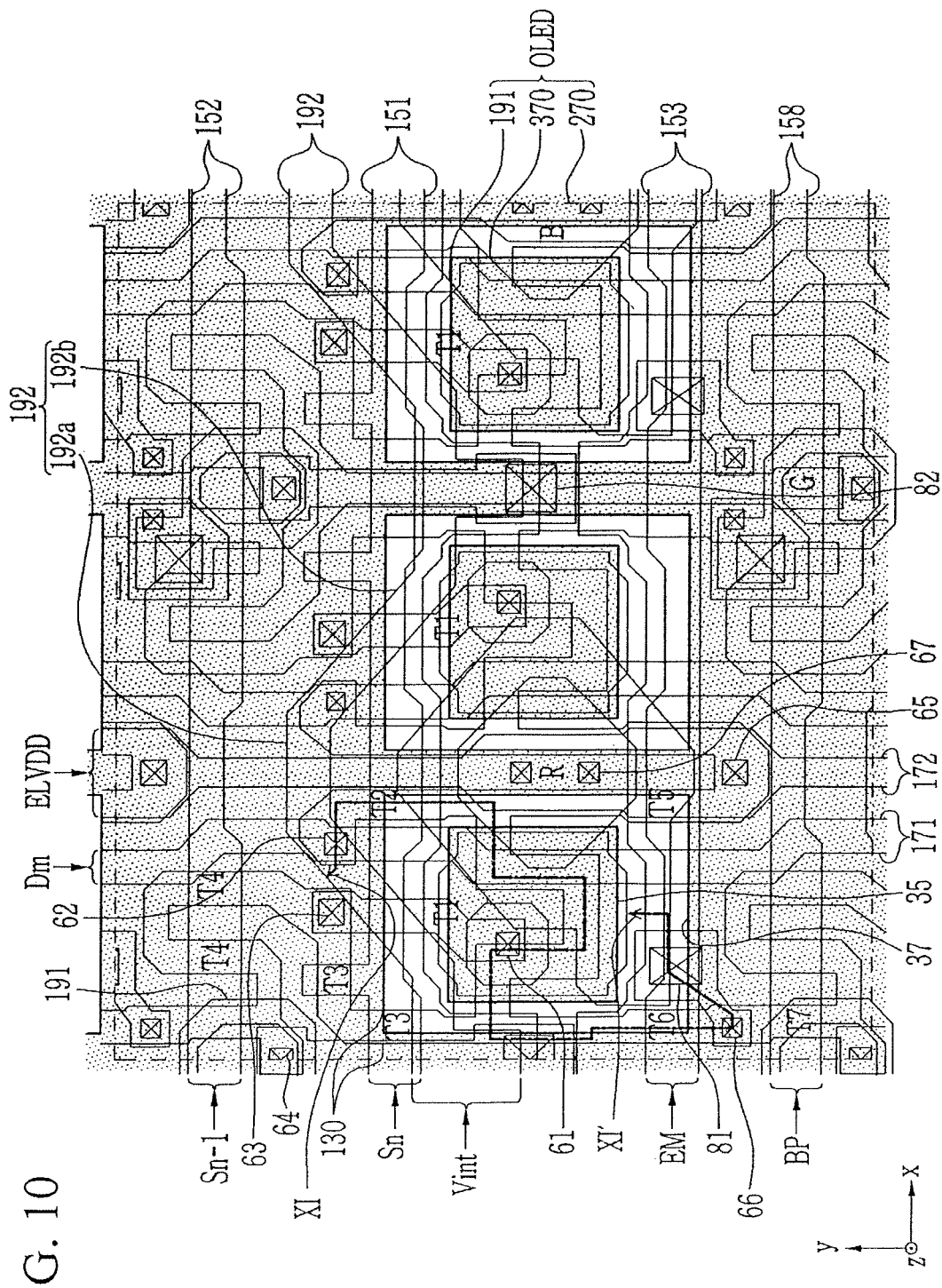
FIG. 10 illustrates a layout view of some pixels of the display device according to the exemplary embodiment.

Referring to FIG. 10, a pixel area including a red pixel R, a blue pixel B, and a green pixel G is illustrated. In the display panel 100, the pixels R, G, and B may be iteratively aligned.

The scan line 151, the previous scan line 152, the emission control line 153, and the bypass control line 158 that respectively transmit the scan signal Sn, the previous scan line Sn-1, the emission control signal EM, and the bypass signal BP may be substantially extended in a first direction x. The bypass control line 158 may be the same as the previous scan line 152. The data line 171 and the driving voltage line 172 that respectively transmit the data signal Dm and the driving voltage ELVDD may substantially extend in a second direction y. In the initialization voltage line 192, a portion 192a that is parallel with the first direction x and an inclined portion 192b may be alternately extended.

The driving transistor T1, the switching transistor T2, the compensation transistor T3, the initialization transistor T4, the operation control transistor T5, the light emission control transistor T6, the bypass transistor T7, the storage capacitor Cst, and the light emitting element EL (OLED) may be formed at positions indicated in FIG. 10.

The light emitting element EL (OLED) may include a pixel electrode 191, an emission layer 370, and a common electrode 270. The compensation transistor T3 and the initialization transistor T4 may have a dual gate structure to prevent a leakage current.

A channel of each of the driving transistor T1, the switching transistor T2, the compensation transistor T3, the initialization transistor T4, the operation control transistor T5, the light emission control transistor T6, and the bypass transistor T7 may be disposed on one semiconductor layer 130. The semiconductor layer 130 may be curved in various shapes.

Positions and alignments of the elements may be variously modified in design.

Figure 11:
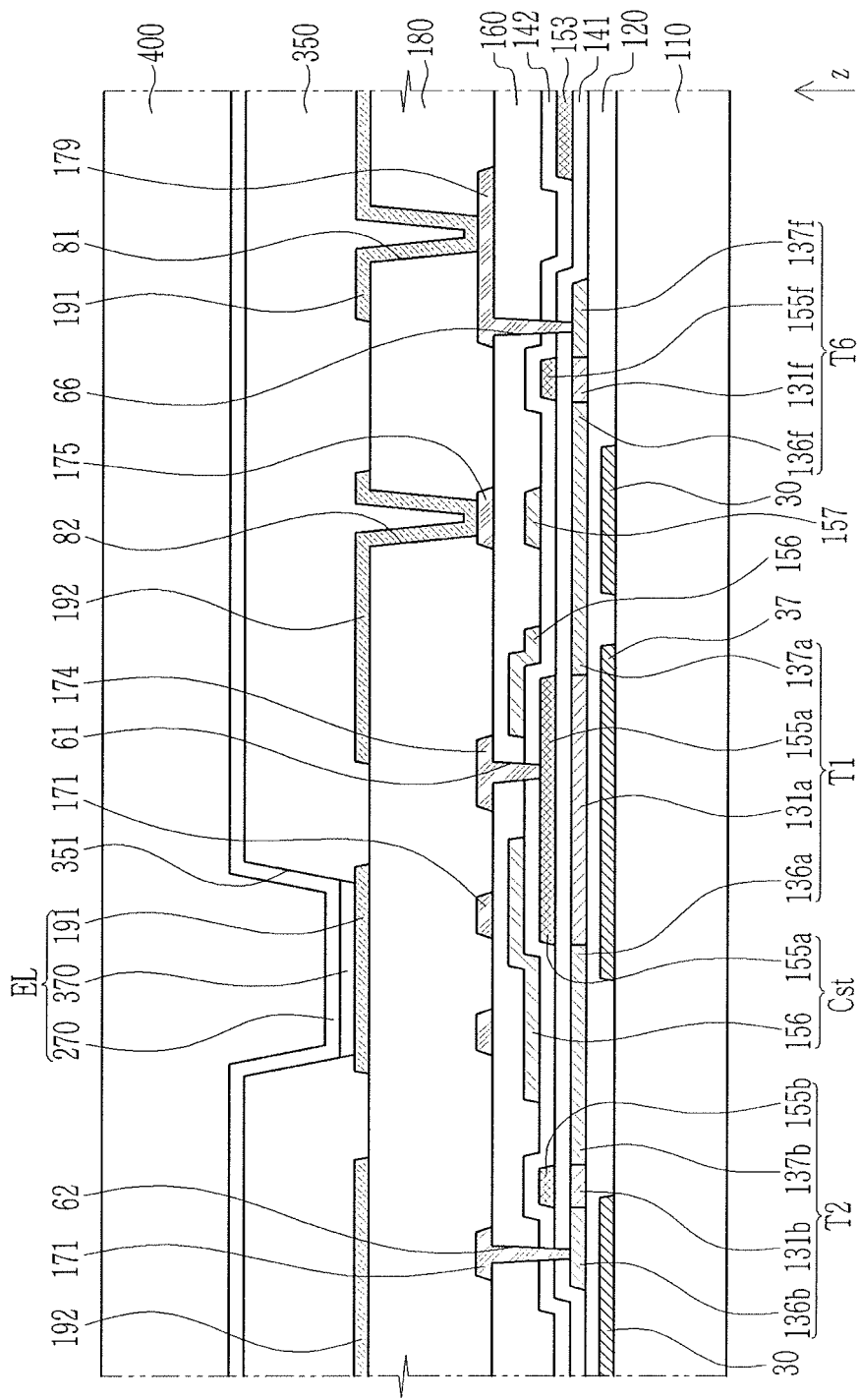
FIG. 11 illustrates a cross-sectional view of FIG. 10, taken along the line XI-XT.

Referring to FIG. 10 and FIG. 11, a cross-sectional structure of the display area DA will be described, mainly focusing on some transistors T1, T2, and T6 and the storage capacitor Cst.

Referring to FIG. 10 and FIG. 11, the display panel 100 may include a substrate 110 and layers and elements that are formed on the substrate 110. The substrate 110 may be a flexible substrate that is made of a polymer such as polyimide, polyamide, polyethylene terephthalate, or the like.

The substrate 110 may include a barrier layer that helps to prevent the dispersion of an impurity that could damage a semiconductor characteristic and helps to prevent the permeation of moisture or the like. The substrate 110 may be a rigid substrate made of glass and the like. One of two parallel sides of the substrate 110 (i.e., a lower side in FIG. 11) may correspond to a rear side of the display panel 100.

A light blocking layer 37 and a pattern 30 may be disposed on the substrate 110. The light blocking layer 37 may prevent deterioration of a characteristic of the semiconductor layer 130 by preventing external light from reaching the semiconductor layer 130. A leakage current of a transistor, particularly, a driving transistor T1 of which a current characteristic is important, may be be controlled by the light blocking layer 37. The light blocking layer 37 may overlap a driving channel 131a, which is a channel of the driving transistor T1. The light blocking layer 37 may include a material that does not transmit light of a particular wavelength. The light blocking layer 37 may be made of, for example, a conductive material such as a metal, a metal alloy, or the like. The light blocking layer 37 may be electrically connected with a driving voltage line 172 and thus may receive a driving voltage ELVDD, or may be electrically connected with a drain electrode D2 of a switching transistor T2 and thus may receive a data signal Dm. For example, the light blocking layer 37 may function as an electrode that receives a particular voltage in the display panel 100. In this case, a current variation rate in a saturation area in a voltage-current characteristic graph of the driving transistor T1 may be reduced such that a characteristic of a current driving transistor may be improved. The light blocking layer 37 may be electrically connected with another transistor or a signal line, or may be in a floated state.

As described above, a pattern 30 may include an alignment pattern 31, an inspection pattern 32, or a light blocking pattern 33. For separation from the light blocking layer 37, the pattern 30 may include an opening 35 that corresponds to an area where the light blocking layer 37 is disposed and may be bigger than the area in size. The light blocking layer 37 may be disposed in the opening 35. The illustrated pattern 30 may be a part of the alignment pattern 31 or the light blocking pattern 33. The light blocking layer 37 and the pattern 30 may be formed of the same material through the same process. For example, the light blocking layer 37 and the pattern 30 may be formed together by stacking a conductive material on a substrate 110 and patterning the conductive material. Thus, an additional process or an additional mask may not be required to form the pattern 30 for the sensor 10.

A buffer layer 120 may be disposed on the light blocking layer 37 and the pattern 30. The buffer layer 120 may block an impurity that could be spread to the semiconductor layer 130 from the substrate 110 and may reduce stress applied to the substrate 110 during a process for forming the semiconductor layer 130. The buffer layer 120 may include an inorganic insulation material such as a silicon oxide, a silicon nitride, or the like. The light blocking layer 37 and the pattern 30 may be disposed on the buffer layer 120. In this case, an insulation layer may be disposed on the light blocking layer 37 and the pattern 30 to cover the light blocking layer 37 and the pattern 30.

The semiconductor layer 130, which includes the driving channel 131a, a switching channel 131b, and a light emission control channel 131f may be disposed on the buffer layer 120. The semiconductor layer 130 may include polysilicon, an oxide semiconductor, or amorphous silicon.

In the semiconductor layer 130, a source electrode 136a and a drain electrode 137a of the driving transistor T1 may be disposed at opposite sides of the driving channel 131a. A source electrode 136b and a driving electrode 137b of the switching transistor T2 may be disposed at opposite sides of the switching channel 131b. In addition, a source electrode 136f and a drain electrode 137f of the light emission control transistor T6 may be disposed at opposite sides of the light emission control channel 131f.

A first insulation layer 141 may be disposed on the semiconductor layer 130. A first gate conductor that includes a scan line 151 that includes a gate electrode 155b of the switching transistor T2, a previous scan line 152, a light emission control line 153 that includes a gate electrode 155f of the light emission control transistor T6, a bypass control line 158, and a gate electrode (first electrode) 155a of the driving transistor T1 may be disposed on the first insulation layer 141.

A second insulation layer 142 may be disposed on the first gate conductor and the first insulation layer 141. A second gate conductor that includes a storage line 157 and a second electrode 156, which is an expansion portion of the storage line 157, may be disposed on the second insulation layer 142. The second electrode 156 may form a storage capacitor Cst together with the first electrode 155a.

The first gate conductor and the second gate conductor may include a metal such as molybdenum (Mo), copper (Cu), aluminum (Al), silver (Ag), chromium (Cr), tantalum (Ta), titanium (Ti), or the like, or a metal alloy. The first insulation layer 141 and the second insulation layer 142 may include an inorganic insulation material such a silicon oxide, a silicon nitride, or the like.

A third insulation layer 160 that includes an inorganic insulation material and/or an organic insulation material, may be disposed on the second insulation layer 142 and the second gate conductor. Contact holes 61 to 67 may be formed in the third insulation layer 160.

A data conductor that includes a data line 171, a driving voltage line 172, a driving connection member 174, an initialization connection member 175, and a pixel connection member 179 may be disposed on the third insulation layer 160. The data line 171 may be connected with the source electrode 136b of the switching transistor T2 through the contact hole 62 formed in the insulation layers 141, 142, and 160. The driving connecting member 174 may be connected with the first electrode 155a through the contact hole 61 formed in the insulation layers 142 and 160 through one end thereof. The other end of the driving connection member 174 may be connected with a drain electrode of the compensation transistor T2 and a drain electrode of the initialization transistor T4 through the contact hole 63 formed in the insulation layers 141, 142, and 160. The initialization connection member 175 may be connected with a source electrode of the initialization transistor T4 through the contact hole 64 formed in the insulation layers 141, 142, and 160. The pixel connection member 179 may be electrically connected with a drain electrode 137f of the light emission control transistor T6 through the contact hole 66 formed in the insulation layers 141, 142, and 160.

The data conductor may include, for example, a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy, and may be provided as a multilayer.

A fourth insulation layer 180 that includes an organic insulation material may be disposed on the data conductor and the third insulation layer 160. The pixel electrode 191 and the initialization voltage line 192 may be disposed on the fourth insulation layer 180. The pixel connection member 179 may be connected with the pixel electrode 191 through a contact hole 81 formed in the fourth insulation layer 180. The initialization connection member 175 may be connected with the initialization voltage line 192 through a contact hole 82 formed in the fourth insulation layer 180.

An insulation layer 350 having an opening 351 that overlaps the pixel electrode 191 may be disposed on the fourth insulation layer 180. The insulation layer 350, which may also be called a pixel definition layer, may include an organic insulation material.

An emission layer 370 may be disposed on the pixel electrode 191. A common electrode 270 may be disposed on the emission layer 370. The common electrode 270 may also disposed on the insulation layer 350, and thus may be formed throughout a plurality of pixels.

The pixel electrode 191 may be an anode. The common electrode 270 may be a cathode. The pixel electrode 191 may include a metal such as silver (Ag), nickel (Ni), gold (Au), platinum (Pt), aluminum (Al), copper (Cu), molybdenum/aluminum neodymium (Mo/AlNd), or the like, or a metal alloy. The pixel electrode 191 may include a transparent conductive material such as indium tin oxide (ITO), indium zinc oxide (IZO), or the like. The pixel electrode 191 may be provided as a multilayer such as ITO/silver (Ag)/ITO. The common electrode 270 may be formed to be thin by using a metal having a low work function, such as calcium (Ca), barium (Ba), magnesium (Mg), aluminum (Al), silver (Ag), or the like such that the common electrode 270 can transmit light. The common electrode 270 may be formed of a transparent conductive material such as ITO, IZO, or the like. A pixel electrode 191, an emission layer 370, and a common electrode 270 of each pixel form a light emission element EL, which can be an organic light emitting diode OLED.

An encapsulation layer 400 that protects the light emitting element EL may be disposed on the common electrode 270. A polarization layer may be disposed on the encapsulation layer 400 to reduce the reflection of external light. The encapsulation layer 400 may be a thin film encapsulation layer that includes at least one inorganic material layer and at least one organic material layer.

As described above, the pattern 30 may be formed of the same material as the light blocking layer 37 through the same process. In some implementations, the pattern 30 may be formed of the same material as another electrode or a conductor of the display panel 100 through the same process. For example, the pattern 30 may be made of the same material as an electrode or a signal line such as the scan line 151, the gate electrode 155a, the second electrode 156, the data line 171, the drive voltage line 172, the pixel electrode 191, or the common electrode 270. The pattern may be formed on the same layer as the electrode or signal line.

By way of summation and review, in a display panel including a protective sheet that is attached to a rear side of the display panel and includes an opening, and a sensor that is attached to the rear side of the display panel in the opening, when pattern that overlaps the opening is formed at the periphery of an area where the sensor is attached, attachment accuracy of the sensor may be increased. In addition, whether or not the sensor is accurately attached may be simply verified, and penetration of external light into the periphery of the sensor may be prevented. In forming of such a pattern, additional processes may be omitted.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
a display panel;
a protective sheet at a rear side of the display panel, the protective sheet including an opening;
a sensor in the opening; and
a pattern in the display panel, the pattern overlapping the opening and including at least one of an alignment pattern and an inspection pattern.

2. The display device as claimed in claim 1, wherein:
the display panel includes a substrate and a buffer layer on the substrate, and
the pattern is between the substrate and the buffer layer.

3. The display device as claimed in claim 2, wherein the display panel further includes:
a transistor on the buffer layer; and
a light blocking layer between the substrate and the buffer layer, the light blocking layer overlapping a semiconductor layer of the transistor, wherein
the pattern is on a same layer as the light blocking layer.

4. The display device as claimed in claim 3, wherein:
the pattern and the light blocking layer are made of a same material, and
the same material includes a metal or a metal alloy.

5. The display device as claimed in claim 1, wherein the pattern includes an alignment pattern around the sensor.

6. The display device as claimed in claim 5, wherein the alignment pattern includes at least one alignment mark.

7. The display device as claimed in claim 6, wherein the alignment mark is at corners of the opening.

8. The display device as claimed in claim 5, wherein the pattern includes a light blocking pattern that does not overlap the alignment pattern.

9. The display device as claimed in claim 8, wherein the light blocking pattern includes at least one light blocking layer on at least one side of the sensor.

10. The display device as claimed in claim 1, wherein the pattern includes an inspection pattern that includes a plurality of inspection lines.

11. The display device as claimed in claim 10, wherein the plurality of inspection lines includes an inspection line that overlaps the sensor and an inspection line that does not overlap the sensor.

12. The display device as claimed in claim 10, wherein the plurality of inspection lines includes an inspection line that is parallel with at least one side of the sensor.

13. The display device as claimed in claim 1, wherein the pattern includes a light blocking pattern.

14. The display device as claimed in claim 1, wherein the sensor is a fingerprint sensor.

15. A display device comprising:
a display panel;

a protective sheet attached to a rear side of the display panel; and a sensor attached to the rear side of the display panel, wherein the protective sheet includes an opening that penetrates the protective sheet with the sensor being in the opening, and the display panel includes a pattern that overlaps the opening and including at least one of an alignment pattern and an inspection pattern.

16. The display device as claimed in claim 15, wherein:

the display panel includes a substrate, the substrate includes a first surface that faces a front side of the display panel and a second surface that faces the rear side of the display panel, and the pattern is on the first surface of the substrate.

17. The display device as claimed in claim 16, wherein the display panel further includes:

a transistor on the substrate; and a light blocking layer between the substrate and the transistor, wherein the pattern is made of a same material as the light blocking layer and is on a same layer as the light blocking layer.

18. The display device as claimed in claim 15, wherein:

the pattern includes an opening, and a light blocking layer is in the opening.

19. The display device as claimed in claim 15, wherein the pattern includes an alignment pattern that includes at least one alignment mark at a periphery of the sensor.

20. The display device as claimed in claim 19, wherein the pattern includes at least one light blocking layer at at least one side of the sensor, the at least one light blocking layer not overlapping the alignment pattern.

21. The display device as claimed in claim 15, wherein the pattern includes an inspection pattern that includes an inspection line that does not overlap the sensor and an inspection line that overlaps the sensor.

22. A display device comprising:

a display panel;

a protective sheet attached to a rear side of the display panel; and a sensor attached to the rear side of the display panel, wherein the protective sheet includes an opening that penetrates the protective sheet with the sensor being in the opening, the display panel includes a pattern that overlaps the opening and is around an attachment region of the sensor, and the pattern is made of a same material as an electrode of the display panel and is on a same layer as the electrode of the display panel.

* * * * *